United States Patent
Ratnakumar et al.

(10) Patent No.: US 7,812,408 B1
(45) Date of Patent: Oct. 12, 2010

(54) INTEGRATED CIRCUITS WITH METAL-OXIDE-SEMICONDUCTOR TRANSISTORS HAVING ENHANCED GATE DEPLETION LAYERS

(75) Inventors: Albert Ratnakumar, San Jose, CA (US); Peter J. McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 366 days.

(21) Appl. No.: 11/975,010

(22) Filed: Oct. 16, 2007

(51) Int. Cl.
*H01L 27/088* (2006.01)
(52) U.S. Cl. .................. 257/391; 257/392; 257/E27.06
(58) Field of Classification Search ................. 257/364, 257/391, 392, 553, E27.06; 438/275
See application file for complete search history.

(56) References Cited

U.S. PATENT DOCUMENTS

| | | | |
|---|---|---|---|
| 5,463,237 A | 10/1995 | Funaki | |
| 5,637,903 A * | 6/1997 | Liao et al. | 257/412 |
| 5,648,668 A | 7/1997 | Kasai | |
| 5,801,416 A | 9/1998 | Choi et al. | |
| 6,348,719 B1 * | 2/2002 | Chapman | 257/412 |
| 6,362,034 B1 | 3/2002 | Sandford et al. | |
| 6,492,676 B2 | 12/2002 | Kusunoki | |
| 6,781,409 B2 | 8/2004 | Turner | |
| 2006/0006440 A1 * | 1/2006 | Liaw | 257/296 |

* cited by examiner

*Primary Examiner*—David Vu
*Assistant Examiner*—Earl N Taylor
(74) *Attorney, Agent, or Firm*—Treyz Law Group; G. Victor Treyz; David C. Kellogg

(57) ABSTRACT

An integrated circuit is provided with groups of transistors that handle different maximum voltage levels. The transistors may be metal-oxide-semiconductor transistors having body, source, drain, and gate terminals. The gate of each transistor may have a gate insulator and a gate conductor. The gate conductor may be formed from a semiconductor such as polysilicon. Adjacent to the gate insulator, the polysilicon gate conductor may have a depletion layer. The depletion layer may have a thickness that is related to the doping level in the polysilicon gate conductor. By reducing the doping level in the polysilicon gates of some of the transistors, the equivalent oxide thickness of those transistors is increased, thereby enhancing their ability to withstand elevated voltages without experiencing gate oxide breakdown due to hot carrier injection effects.

18 Claims, 11 Drawing Sheets

| TRANSISTOR TYPE | $L_{MIN}$ | $V_{MAX}$ | $T_{OX}$ | GATE DOPING | GATE DEPLETION LAYER THICKNESS | EOT |
|---|---|---|---|---|---|---|
| CORE | 45nm | 0.9V | 12Å | ~$10^{20}$ | 5Å | 17Å |
| CORE | 45nm | 1.1V | 17Å | ~$10^{20}$ | 5Å | 22Å |
| I/O | 270nm | 2.5V | 60Å | ~$10^{20}$ | 8Å | 68Å |
| I/O | 350nm | 3.3V | 80Å | ~$10^{20}$ | 12Å | 92Å |

(PRIOR ART)
FIG. 9

| TRANSISTOR TYPE | $L_{MIN}$ | $V_{MAX}$ | $T_{OX}$ | GATE DOPING | GATE DEPLETION LAYER THICKNESS | EOT |
|---|---|---|---|---|---|---|
| CORE | 45nm | 0.9V | 12Å | $10^{20}$ | 5Å | 17Å |
| CORE | 45nm | 1.1V | 17Å | $10^{20}$ | 5Å | 22Å |
| I/O | 270nm | 2.5V | 60Å | $10^{20}$ | 8Å | 68Å |
| I/O | 350nm | 3.3V | 60Å | $8 \times 10^{18}$ | 38Å | 98Å |

FIG. 10

INTEGRATED CIRCUITS WITH METAL-OXIDE-SEMICONDUCTOR TRANSISTORS HAVING ENHANCED GATE DEPLETION LAYERS

BACKGROUND

This invention relates to integrated circuits, and more particularly, to integrated circuits with metal-oxide-semiconductor transistors that have enhanced gate depletion layers for increasing the resistance of the transistors to voltage-induced degradation.

Metal-oxide-semiconductor (MOS) transistors are commonly used to form circuitry on integrated circuits. For example, integrated circuits often use complementary metal-oxide-semiconductor (CMOS) transistor technology. CMOS integrated circuits have n-channel metal-oxide-semiconductor (NMOS) and p-channel metal-oxide-semiconductor (PMOS) transistors.

NMOS and PMOS integrated circuits have four terminals—a drain, a source, a gate, and a body. The body, which is sometimes referred to as the well of a transistor, is typically formed from silicon. A doped body contact is used to form a body terminal. For example, re-channel transistors have bodies that are doped p-type. In a p-type body, the body contact is formed from a heavily doped p+ region. Source and drain terminals are formed by doping source and drain regions within the body. In an n-channel transistor, the source and drain regions are heavily doped with n-type dopant (i.e., the source and drain regions are doped n+).

In each transistor, a gate is formed between the source and drain. The gate includes a silicon oxide insulating layer. A gate conductor is formed on top of the gate insulator. The gate conductor may be, for example, a layer of metal. In modern integrated circuits, the gate conductor of an MOS transistor is typically formed from heavily doped polysilicon. The gate conductor in this type of transistor is generally doped as heavily as possible to ensure that the transistor switches rapidly during operation.

In many system environments, different transistors on an integrated circuit are exposed to different voltages. For example, the interior or core portion of many integrated circuits operates at a relatively low power supply voltage. Low voltage core logic can help to reduce power consumption. Low voltage designs can also be useful when forming transistors with relatively small dimensions (i.e., when scaling a design to a small size to increase circuit density).

Input-output circuitry on an integrated circuit is often located around the periphery of the integrated circuit. Input-output circuitry is used to provide an interface between the core logic of the integrated circuit and external circuitry. For example, input-output circuitry can be used to send and receive signals over parallel and serial data paths. To provide sufficient signal strength to overcome noise, the voltages of the data signals that are transmitted over the parallel and serial data paths may be larger than the voltages of the signals within the core logic of the integrated circuit. For example, the signals on external data paths may have voltages of three volts or more, whereas core logic may operate at signals of less than one volt.

The transistors in the input-output circuitry or other circuitry on an integrated circuit that handles elevated voltages must be more robust than the transistors in the core logic. For example, it may be desirable to form thicker gate oxides in the MOS transistors in input-output circuits than in the MOS transistors of core logic circuits. By forming thicker gate oxides in the input-output transistors, the input-output transistors may be made more resistant to breakdown induced by hot carriers.

It is generally not advantageous to form MOS transistors with thicker gate oxides than is necessary to resist hot carrier breakdown. This is because transistors with overly thick gate oxides tend to switch slowly. If, for example, all of the transistors in the core logic of an integrated circuit were fabricated with gate oxides sufficient to withstand high voltage input-output data signals, the switching speed of the core logic would be significantly reduced. Such reduced switching speeds are often unacceptable.

As a result, some integrated circuits use different transistor designs for different parts of the circuit. Input-output transistors that are exposed to a relatively high maximum voltage are provided with the thickest gate oxide layers. Core logic transistors that are exposed to a relatively low maximum voltage are provided with the thinnest gate oxides layers to ensure adequate switching performance. Still other transistors, which are exposed to voltages of intermediate magnitude, may be provided with gate oxides having a thickness that lies between the core logic gate oxide thickness and the input-output circuitry gate oxide thickness.

As circuits become more complex, it may become increasingly desirable to provide a range of input-output interface options. For example, it may be desirable for the input-output circuitry on an integrated circuit to support communications protocols that have different associated voltage levels. When supporting a range of protocols, it may be necessary to construct input-output transistors to handle the worst case voltage levels that are expected to be encountered. As an example, it may be necessary to form all input-output circuit transistors in an input-output circuit with a relatively thick gate oxide to ensure that these transistors will not be damaged by hot carriers in the event that relatively high voltage signals are encountered. However, providing all input-output transistors with relatively thick gate oxides will reduce transistor switching speeds below what is necessary in the event that only lower voltage input-output signals are encountered.

An alternative to enhancing the voltage handling capabilities of all input-output circuit transistors by providing them with thick gate oxides is to enhance the voltage handling capabilities of a limited number of the input-output circuit transistors. With this type of approach, some of the input-output transistors may be provided with thick gate oxides to handle the relatively larger voltages that are associated with a legacy communications protocol, whereas other input-output transistors may be provided with somewhat thinner gate oxides to handle lower input-output voltage levels. Core logic transistors may be fabricated with an even thinner gate oxide thickness to ensure optimum switching speeds are obtained for the main processing circuitry on the integrated circuit.

Although this type of arrangement may be satisfactory in some circumstances, there can be significant disadvantages to arrangements with large numbers of different transistor gate oxide thicknesses. Each transistor gate oxide thickness that is supported increases the complexity of the semiconductor fabrication process that is used during manufacturing. If the process that is used to manufacture an integrated circuit with multiple transistor gate oxide thicknesses becomes too complex, manufacturing yield and throughput may degrade to unacceptable levels.

It may therefore be impractical to provide integrated circuits with as many different transistor types as desired. As a result, certain transistors may have oxides that are too thick for optimum performance or signals with certain voltage levels may not be supported by the integrated circuit. Device performance and compatibility with legacy protocols may therefore suffer.

In view of these challenges it would be desirable to be able to provide improved integrated circuits with transistors capable of supporting different voltage levels.

SUMMARY

In accordance with the present invention, integrated circuits such as programmable logic device integrated circuits are provided that have multiple groups of transistors. Each group of transistors may be configured to handle a different maximum voltage. The transistors may be metal-oxide-semiconductor transistors that each have a body, source, drain, and gate. Each gate may have an associated gate oxide and associated gate conductor.

The gate conductors may be formed from semiconductors such as polysilicon. The polysilicon may be doped. To improve the ability of some of the transistors to withstand elevated voltages without increasing their gate oxide layer thicknesses, the polysilicon gate doping levels in at least some of the transistors may be reduced relative to the source and drain contacts and relative to the doped polysilicon gates of other transistors. By reducing the doping level in the gate conductors of these transistors, depletion layer thicknesses in the gate conductors can be increased. This increases the equivalent oxide thickness for the transistors and enhances their ability to operate at elevated voltages without exhibiting gate oxide breakdown due to hot carrier effects.

Further features of the invention, its nature and various advantages will be more apparent from the accompanying drawings and the following detailed description.

BRIEF DESCRIPTION OF THE DRAWINGS

FIG. 9 is a table showing the types of metal-oxide-semiconductor transistors present on a conventional integrated circuit.

FIG. 10 is a table showing illustrative metal-oxide-semiconductor transistor types that may be present on an integrated circuit in accordance with an embodiment of the present invention.

DETAILED DESCRIPTION

The present invention relates to metal-oxide-semiconductor (MOS) transistors that are formed on integrated circuits. The integrated circuits may be of any suitable type. With one suitable arrangement, metal-oxide-semiconductor transistors in accordance with an embodiment of the invention are formed on integrated circuits such as programmable logic device integrated circuits. This is, however, merely illustrative. Metal-oxide-semiconductor transistors in accordance with embodiments of the invention may be formed on integrated circuits such as digital signal processors, microprocessors, custom integrated circuits, or other integrated circuits. The present invention is sometimes described in the context of programmable logic device integrated circuits as an example.

Programmable logic device integrated circuits can be customized using configuration data. In a typical scenario, a logic designer uses a computer-aided design (CAD) system in designing a desired logic circuit. The computer-aided design system uses information on the hardware capabilities of a programmable logic device to generate configuration data.

Programmable logic devices contain programmable elements. The programmable elements may be based on any suitable programmable technology such as fuses, antifuses, laser-programmed elements, electrically-programmed elements, non-volatile memory elements, volatile memory elements, mask-programmed elements, etc. In a typical scenario, the programmable elements are based on random-access memory (RAM) cells.

To customize programmable logic devices to implement the desired logic circuit, the configuration data produced by the computer-aided design system is loaded into the programmable elements. During operation of the programmable logic device, each programmable element provides a static output signal based on its loaded configuration data. The outputs signals from the programmable elements are applied to the gates of metal-oxide-semiconductor transistors in regions of programmable logic on the programmable logic device. This configures the programmable logic so that the programmable logic device implements the desired logic circuit.

Figure 1:
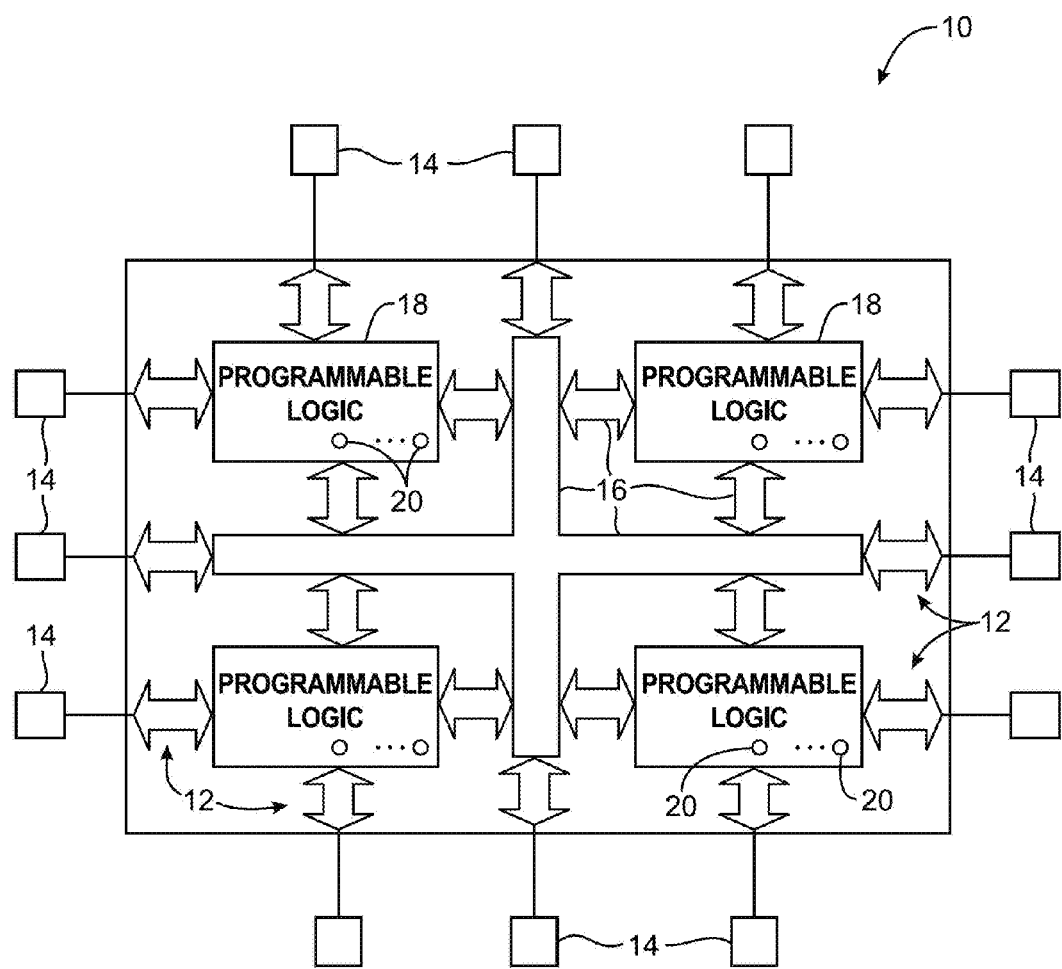
FIG. 1 is a diagram of an illustrative integrated circuit such as a programmable logic device integrated circuit in accordance with an embodiment of the present invention.

An illustrative programmable logic device 10 in accordance with the present invention is shown in FIG. 1. Programmable logic device 10 has input-output circuitry 12 for driving signals off of device 10 and for receiving signals from other devices via input-output pins 14. Interconnection resources 16 such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a type of programmable logic.

The programmable elements 20 in logic 18 may be loaded from any suitable source. In a typical arrangement, the programmable elements are loaded from an external erasable-programmable read-only memory and control chip called a configuration device via pins 14 and input-output circuitry 12.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The primary processing circuitry of integrated circuits such as integrated circuit 10 of FIG. 1 may be located in the central region of the device. Input-output circuitry 12 is typically located around the periphery of the integrated circuit. The central region of the device is sometimes referred to as the core of the device and the circuitry in that region is sometimes referred to as core circuitry or core logic.

Many integrated circuits use multi-level power supply schemes in which core circuitry is powered using a relatively low power supply level and input-output predriver circuits and other peripheral components are powered using one or more elevated supply levels. The core logic power supply level is sometimes referred to as Vcc-core or Vcc. The core logic and other circuitry on device 10 may have an associated ground voltage Vss. The value of Vss may be, for example, 0 volts.

It may be desired to power one or more portions of circuitry on device 10 using positive power supply voltages other than Vcc-core. For example, input-output circuitry 12 or other circuitry on device 10 may be powered using elevated voltages Vccio1 and Vccio2. The value of Vccio1 may be, as an example, 3.3. volts and the value of Vccio2 may be, as an example, 2.5 volts. This type of configuration may be used in situations in which some input-output circuitry 12 or other circuitry on device 10 is used to handle data signals with a magnitude of about 3.3 volts (e.g., signals that range between Vss and 3.3 volts) whereas other circuitry (e.g., other input-output circuitry 12) is used to handle data signals with a magnitude of about 2.5 volts (e.g., signals that range between Vss and 2.5 volts).

For proper operation of logic components, it is generally desirable to power the circuitry on a device with a power supply level that equals or exceeds the magnitude of the data signals handled by that circuitry. For example, if a circuit needs to handle data signals that have a logic high value of 2.5 volts and a logic low value of 0 volts, the circuit should be powered using a 2.5 volt positive power supply voltage. If the power supply voltage for this type of circuit is less than 2.5 volts, the inverters and other components in the circuit may not operate as desired.

It may be desirable to handle signals with multiple voltage levels to provide legacy support in a newer integrated circuit. For example, although an integrated circuit may be designed primarily to handle a newer data communications protocol that uses 2.5 volt signals, there may still be situations in which the integrated circuit should be able to interface with external components using a 3.3 volt communications protocol. It may also be desirable to provide two or more different types of core logic operating at different speeds. These different portions of the core logic may be powered using different power supply levels.

In general, any suitable number of different power supply levels may be used to power device 10. An integrated circuit 10 that has a ground voltage Vss of 0 volts and that is powered using elevated positive power supply voltages of 3.3 volts and 2.5 volts and core logic power supply voltages of 1.1 volts and 0.9 volts is sometimes described herein as an example. This set of power supply voltages is, however, merely illustrative. Integrated circuit 10 may include any suitable number of circuits powered with any suitable number of different power supply voltages. These power supply voltages may be supplied to device 10 from external sources using pins 14, may be generated internally (e.g., using static or dynamic voltage regulator circuitry), or may be supplied using both external and internal sources.

Figure 2:
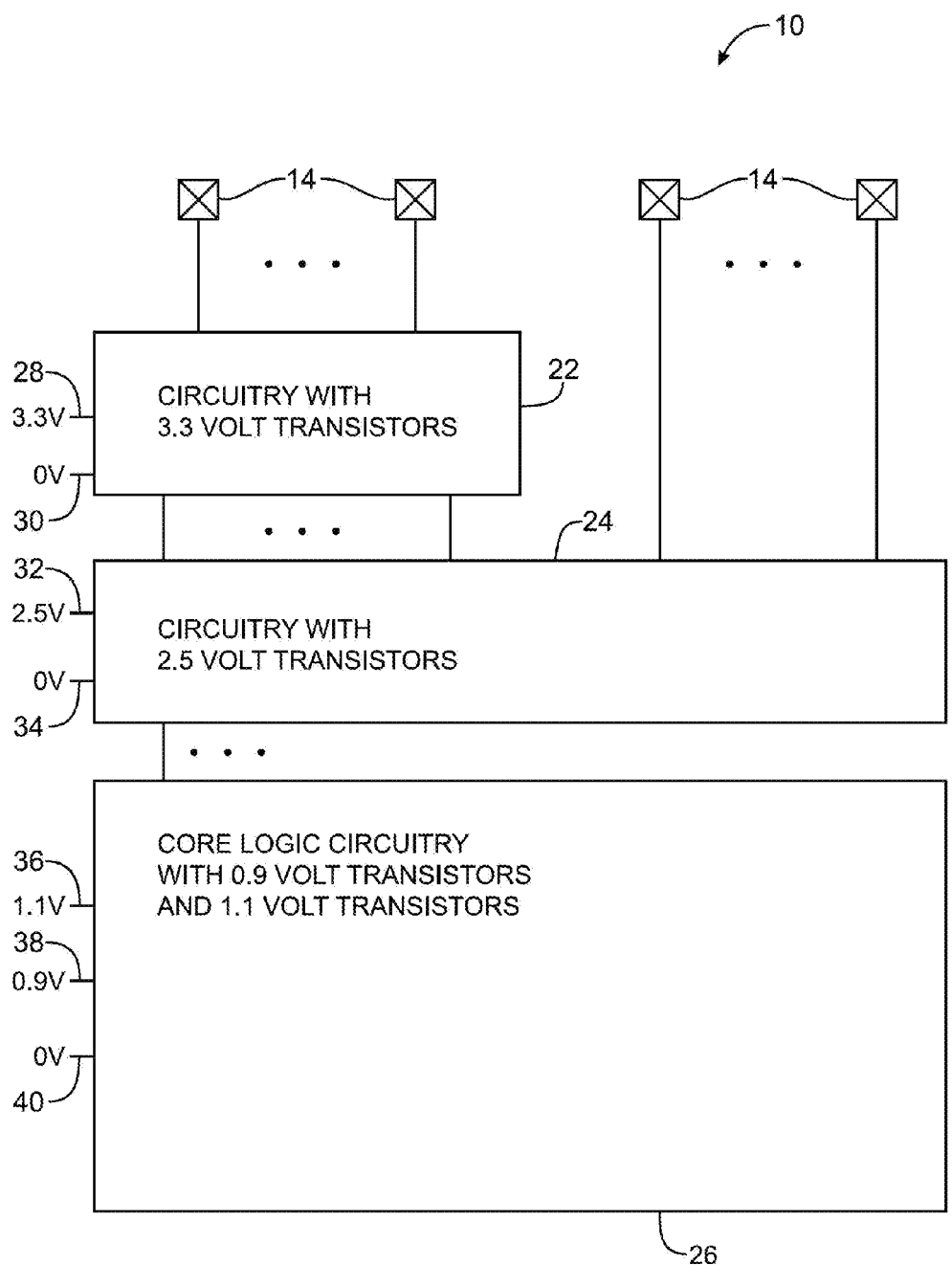
FIG. 2 is a schematic diagram of illustrative circuitry on an integrated circuit having transistors that support multiple voltages levels in accordance with an embodiment of the present invention.

An illustrative integrated circuit such as a programmable logic device 10 with multiple associated power supply levels is shown in FIG. 2. As shown in FIG. 2, integrated circuit 10 may have circuitry 22 that contains 3.3 volt transistors, circuitry 24 that contains 2.5 volt transistors, and core logic circuitry 26 that contains 1.1 volt transistors and 0.9 volt transistors. Circuitry 22 may receive a positive power supply voltage of 3.3 volts from terminal 28 and a ground voltage of 0 volts from terminal 30. Terminals such a terminals 28 and 30 may, if desired, be connected to external power supply sources through pins 14. Internal sources of power supply voltage may also be applied to terminals 28 and 30. Circuitry 24 may be powered using a positive power supply voltage of 2.5 volts at terminal 32 and a ground voltage of 0 volts at terminal 34. Circuitry 26 may receive a 1.1 volt positive power supply at terminal 36 and a 0.9 volt power supply at terminal 38. A ground voltage of 0 volts may be supplied using line 40. Power supply terminals such as terminals 32, 34, 36, 38, and 40 may be connected to external sources via pins 14 or may be connected to internal voltage regulator circuitry. Pins 14 may be used to route data signals to circuitry 22 and 24 (and, if desired, core logic 26). Circuitry such as circuitry 22 and 24 that interfaces with external circuitry via pins 14 is sometimes referred to as input-output circuitry.

The programmable logic and other circuitry on the programmable logic device may be formed from n-channel metal-oxide-semiconductor field-effect transistors (n-channel MOS transistors or NMOS transistors) and p-channel metal-oxide-semiconductor field-effect transistors (p-channel MOS transistors or PMOS transistors). Integrated circuits with NMOS and PMOS transistors are sometimes referred to as complementary metal-oxide-semiconductor (CMOS) integrated circuits.

In CMOS integrated circuits with multiple power supply levels, the transistors in the core logic (e.g., circuitry 26 of FIG. 2) or other regions of the integrated circuit that have relatively lower power supply voltages do not need to withstand voltage levels as large as the transistors in the input-output circuitry or other circuitry that has relatively higher power supply voltages (e.g., the transistors in circuitry 22 and 24). As a result, the transistors in the core logic can be made using higher-performance designs than the transistors in the input-output circuitry. Because the transistors in the input-output circuitry are exposed to larger voltages, these transistors should be formed using a more robust design.

Metal-oxide-semiconductor transistors have source and drain terminals (sometimes collectively referred to as source-drains), body terminals, and gate terminals. The gate of a metal-oxide-semiconductor transistor has an associated gate insulator and gate conductor. The gate insulator separates the gate conductor from the underlying semiconductor channel region of the transistor. In a typical scenario, the gate insulator is formed from silicon oxide. If desired, the gate insulator may be formed from other insulating materials (e.g., so-called high-k dielectrics such as hafnium-based dielectrics, nitrides, oxynitrides, oxides other than silicon oxide, etc.). These various insulating materials are generally referred to herein as gate oxides. Moreover, transistors with non-oxide gate insulators are still generally referred to as NMOS and PMOS transistors, regardless of the specific composition of their gates.

The gate conductor of a metal-oxide-semiconductor transistor may be formed from a metal or other suitable conductive material. With one suitable arrangement, the gate conductor is formed from a doped semiconductor such as doped polysilicon. The use of doped polysilicon for the gate conductor may be advantageous because this type of gate conductor is process compatible and can be readily manufactured. During a typical gate conductor fabrication process, a layer of polysilicon is formed on top of a previously formed layer of gate oxide. The as-grown polysilicon is generally undoped or lightly doped (e.g., its dopant concentration level is less than $10^{18}$ cm$^{-3}$ or less than $10^{17}$ cm$^{-3}$). Dopant can be added to the polysilicon by ion implantation or other suitable techniques. When the polysilicon of the gate is doped sufficiently, the polysilicon becomes highly conductive and can serve as the gate conductor.

Figure 3:
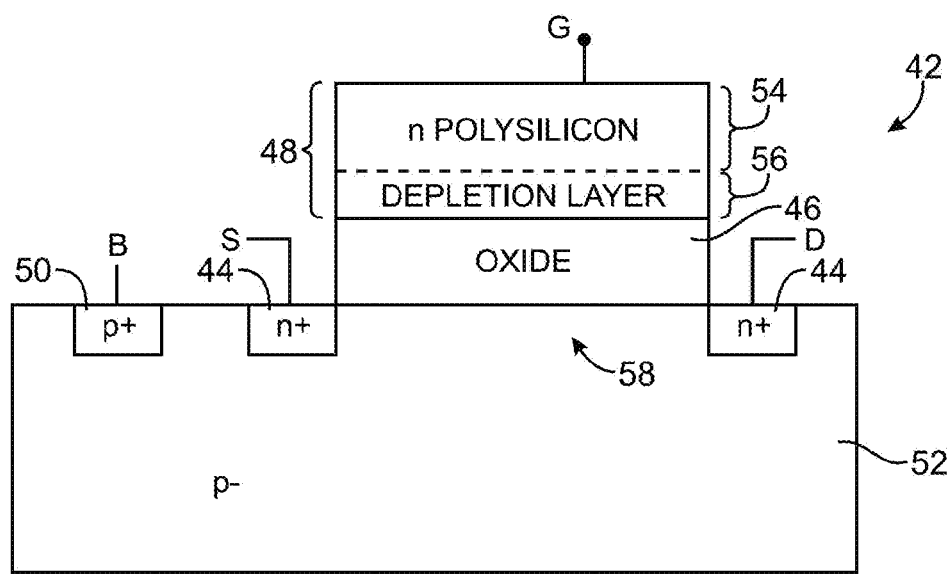
FIG. 3 is a cross-sectional view of an illustrative n-channel metal-oxide-semiconductor transistor in accordance with an embodiment of the present invention.

A schematic diagram of an illustrative n-channel metal-oxide-semiconductor transistor 42 is shown in FIG. 3. The source of transistor 42 is labeled S, the drain is labeled D, the gate is labeled G, and the body is labeled B. Source S and drain D are formed using implant regions 44. Gate G is formed from a thin layer of insulator 46 such as silicon oxide and a gate conductor such as polysilicon. Gate G may have a silicided upper layer portion (not shown). Body terminal B may use implant region 50 to form an ohmic contact with p-type body region 52.

As shown in FIG. 3, the polysilicon or other semiconductor that forms gate conductor 48 may have an undepleted layer 54 and depleted layer 56. In undepleted layer 54, dopant produces majority carriers (i.e., electrons) that cause layer 54 to exhibit a high conductivity. In depleted layer 56, there are no free electrons. As a result, layer 56 has a low conductivity (i.e., a high resistivity). In layer 56, the dopant (in the absence of free electrons) generates a fixed positive charge per unit volume.

During operation, a gate voltage may be applied to gate G to control the formation of a channel in channel region 58. When the voltage on gate G is low (e.g., 0 volts), no channel is formed in region 58. When the voltage on gate G is high (e.g., 3.3 volts), minority carriers (i.e., electrons in an NMOS transistor such as transistor 42) are drawn into channel region 58. This forms a conductive path between source S and drain D.

Transistors such as transistor 42 are subject to breakdown due to hot carrier effects. For example, if drain D is biased at a positive voltage while source S is grounded, hot carriers (i.e., electrons in an NMOS device) may be generated in channel 58. These hot carriers can be injected into gate oxide layer 46 and can cause gate oxide layer 46 to break down. If gate oxide layer 46 breaks down, transistor 42 will fail. Hot carriers may also be drawn through oxide layer 46 when the voltage on gate G is higher than expected. For example, if the voltage on gate G is 3.3 volts, but transistor 42 is designed only to withstand gate voltages of 2.5 volts, an elevated number of hot carriers (i.e., electrons) may be drawn through gate oxide layer 46 (e.g., by tunneling). These hot carriers can charge oxide layer 46 and cause transistor 46 to fail.

Figure 4:
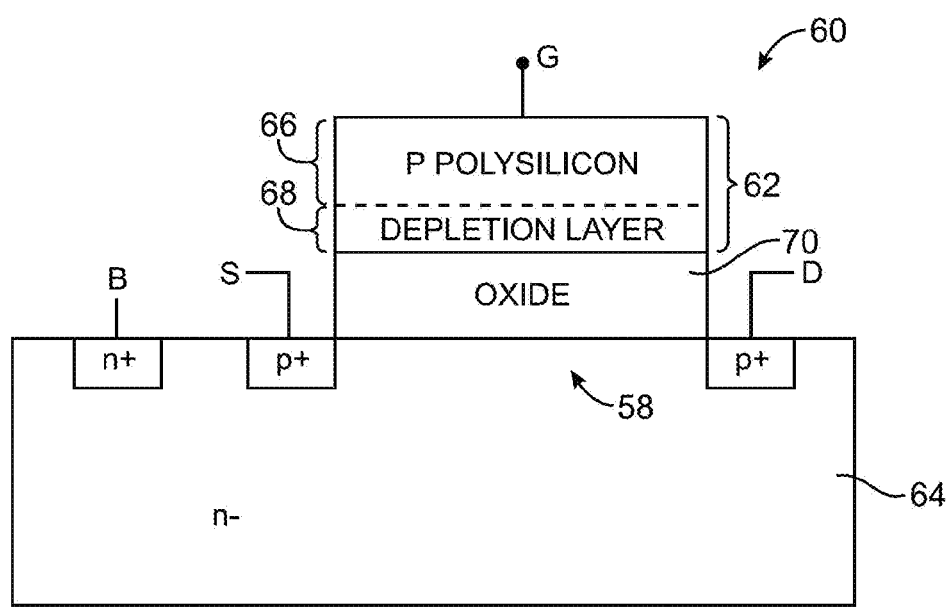
FIG. 4 is a cross-sectional view of an illustrative p-channel metal-oxide-semiconductor transistor in accordance with an embodiment of the present invention.

An illustrative p-channel transistor 60 is shown in FIG. 4. PMOS transistor 60 of FIG. 4 has a gate G that is formed from a p-type polysilicon layer 62 and has an n-type body. The contact region for body terminal B may be doped n+ and the source and drain contacts for source S and drain D may be doped p+. Polysilicon layer 62 may have an undepleted layer 66 and a depleted layer 68. Gate G may have a gate oxide layer 70.

As with NMOS transistors such as transistor 42 of FIG. 3, PMOS devices such as PMOS transistor 60 of FIG. 4 may experience failure due to hot-carrier-induced gate oxide breakdown. PMOS devices fail due to the injection of hot holes, rather than the injection of hot electrons. For NMOS devices, device failure is most likely when the body terminal B is grounded (e.g., at 0 volts), whereas the gate terminal G is at a positive power supply level (e.g. 3.3 volts). For PMOS devices, device failure is most likely when the body terminal B is at a positive power supply voltage (e.g., 3.3 volts) and the gate G is at ground (e.g., 0 volts).

To prevent gate oxide breakdown in devices such as transistor 42 of FIG. 3 and transistor 60 of FIG. 4, the thickness of gate oxide layers such as gate oxide layer 46 of FIG. 3 and gate oxide layer 70 of FIG. 4 should not be too thin. If the gate oxide in a transistor is too thin, the gate oxide will be susceptible to breakdown due to hot carrier effects. At the same time, the thickness of the oxide layer should not be made too thick. Gate oxide thicknesses that are too thick will slow transistor switching speeds. Proper gate oxide thickness selection therefore involves striking a balance between performance and reliability considerations.

As with the thickness of the gate oxide layer, the thickness of the gate conductor depletion layer (e.g., depletion layer 56 of FIG. 3 and depletion layer 68 of FIG. 4) affects device performance. If the depletion layer is not sufficiently thin, the switching speed of a transistor may be reduced to unacceptable levels.

To address this potential problem, conventional transistors heavily dope the polysilicon layer in the transistor gate. For example, dopant may be introduced to the polysilicon layer of the gate at a doping concentration of $10^{20}$ cm$^{-3}$ or more. This reduces the depletion layer thickness to its minimum possible level and ensures maximum device performance.

The thickness of the depletion layer in a gate can have an impact on the ability of a transistor to withstand hot carrier effects. For example, if the thickness of the depletion layer is 5 Å and the oxide thickness is 12 Å, the equivalent oxide thickness (EOT) of the gate is 17 Å (5 Å+17 Å). Increased depletion layer thicknesses are known to slow transistor switching speed, so conventional transistors use designs that minimize depletion layer thickness.

Figure 5:
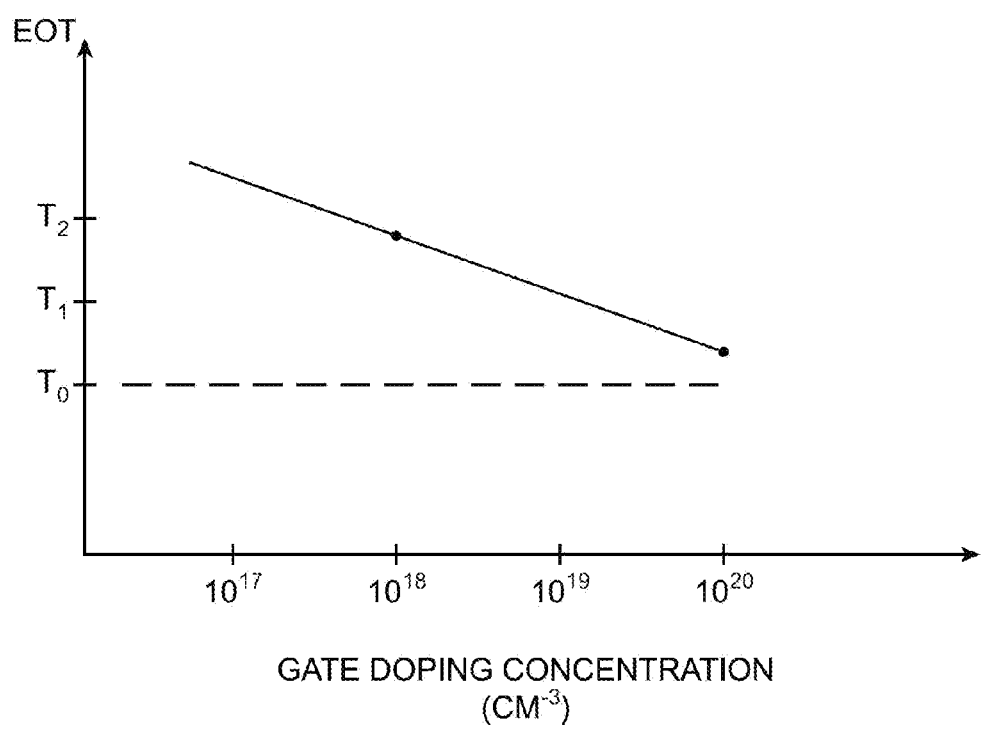
FIG. 5 is a graph showing how a metal-oxide-semiconductor transistor with a doped polysilicon gate has an equivalent oxide thickness (EOT) that varies as a function of gate doping in accordance with an embodiment of the present invention.

However, as shown in the graph of FIG. 5, it is possible to increase the equivalent oxide thickness (EOT) of a transistor substantially by lowering gate doping levels. At high doping concentrations (e.g., when doping the polysilicon in a gate at $10^{20}$ cm$^{-3}$), a transistor may have an EOT value T1 that is close to the gate oxide thickness TO. At lower doping concentrations (e.g., when doping the polysilicon in a gate at $10^{18}$ cm$^{-3}$), a transistor may have an EOT value T2 that is significantly increased relative to the gate oxide thickness T0. The enhanced equivalent oxide thickness at doping values below about $10^{19}$ cm$^{-3}$ tends to increase the ability of a transistor to withstand large voltages by improving the transistor's immunity to hot carrier degradation (although exhibiting reduced switching speeds).

The ability to selectively tailor the EOT value of a particular group of transistors on an integrated circuit by forming a thicker depletion layer for those transistors rather than forming a thicker gate oxide layer may be exploited to reduce the number of different oxide thicknesses that are required on a given integrated circuit. For example, if it is desired to provide transistors that can handle a particular power supply voltage on an integrated circuit, these transistors can be provided by reducing the doping concentration of their polysilicon gates. Gates with reduced doping concentrations exhibit enhanced EOT values, as shown in FIG. 5. Because it is not necessary to increase the gate oxide thicknesses for these transistors, the additional process steps that would otherwise be required to fabricate the gates for the transistors can be avoided.

Consider, as an example, an integrated circuit of the type described in connection with FIG. 2. In this type of device, it is desirable to form four sets of transistors. A first group of transistors is used to handle 0.9 volt signals. A second group of transistors is used to handle 1.1 volt signals. Third and fourth groups of transistors are used to handle 2.5 volt and 3.3 volt signals, respectively. The first, second, and third sets of transistors may each have unique gate oxide thicknesses.

To reduce the number of different gate oxide thicknesses that must be fabricated on the integrated circuit, the fourth group of transistors may have the same physical gate oxide thickness as the third group of transistors, but may be provided with an elevated EOT value by reducing the doping level in the polysilicon gates of the fourth group of transistors relative to the doping level in the gates of the other transistors. With this type of arrangement, the doping of the polysilicon gates in the fourth group of transistors is less than the doping of the polysilicon gates in the third group of transistors. As a result, the fourth group of transistors can withstand higher voltage levels than the third group of transistors without exhibiting oxide breakdown effects due to hot carrier injection. The transistors in the fourth group can handle signals with larger voltages than the transistors in the third group, even though the gate oxide thicknesses of the transistors in the third and fourth groups are the same.

Figure 6:
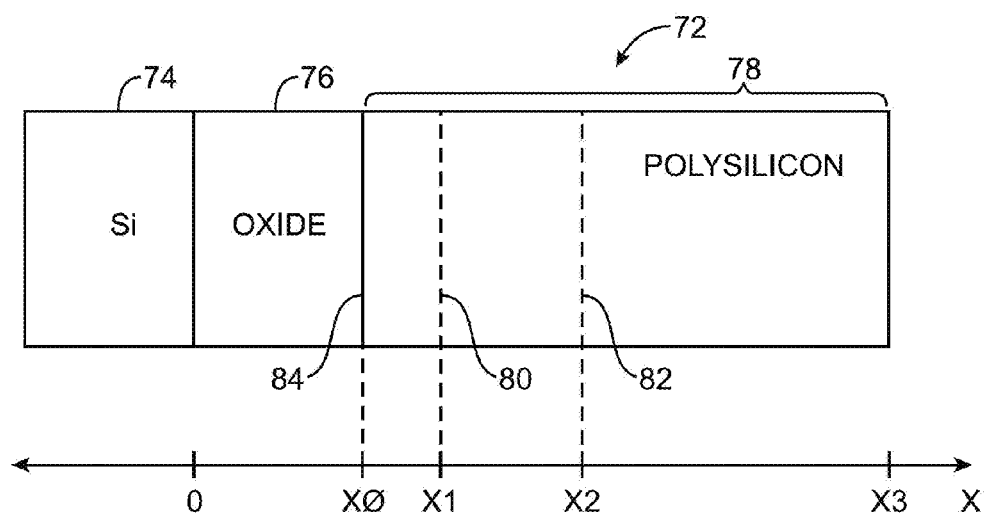
FIG. 6 is a cross-sectional view of a portion of a metal-oxide-semiconductor transistor in the vicinity of the transistor's gate in accordance with an embodiment of the present invention.

A cross-sectional view of a portion of an illustrative transistor is shown in FIG. 6. As shown in FIG. 6, transistor 72 may have a silicon region 74 (e.g., a silicon body), a gate oxide layer 76, and a polysilicon gate conductor layer 78. The interface between silicon 74 and oxide layer 76 is formed at position X=0. The interface between oxide layer 76 and polysilicon gate layer 78 is formed at line 84 (position X=X0). Depending on the doping concentration of polysilicon gate 78, the interface between the depletion layer is either formed at line 80 or 82. For example, for a given applied voltage on the gate, the depletion layer width may be X1-X0 (if the gate is doped at a higher doping concentration) or may be X2-X0 (if the gate is doped at a lower doping concentration level).

Figure 7:
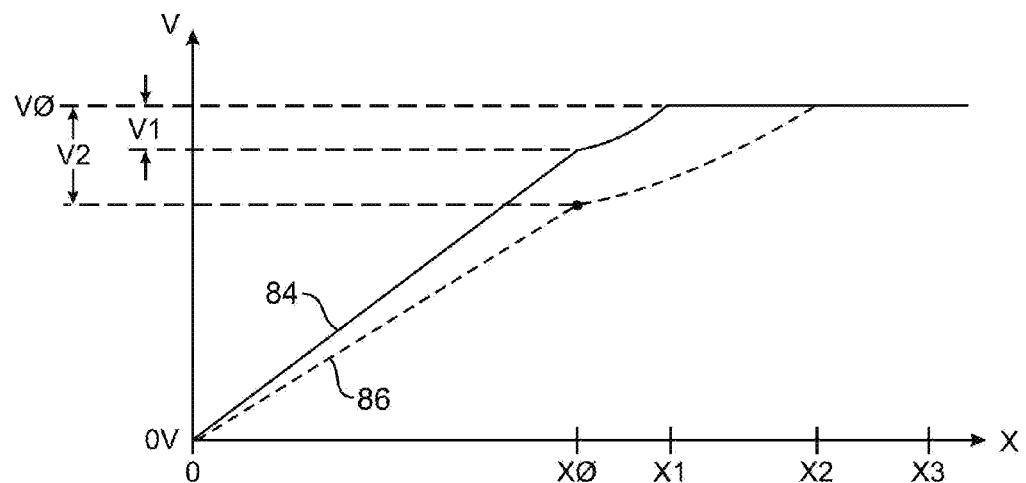
FIG. 7 is a graph showing how the voltage across a transistor of the type shown in FIG. 6 may vary as a function of location within the transistor and as a function of gate conductor doping level in accordance with an embodiment of the present invention.
Figure 8:
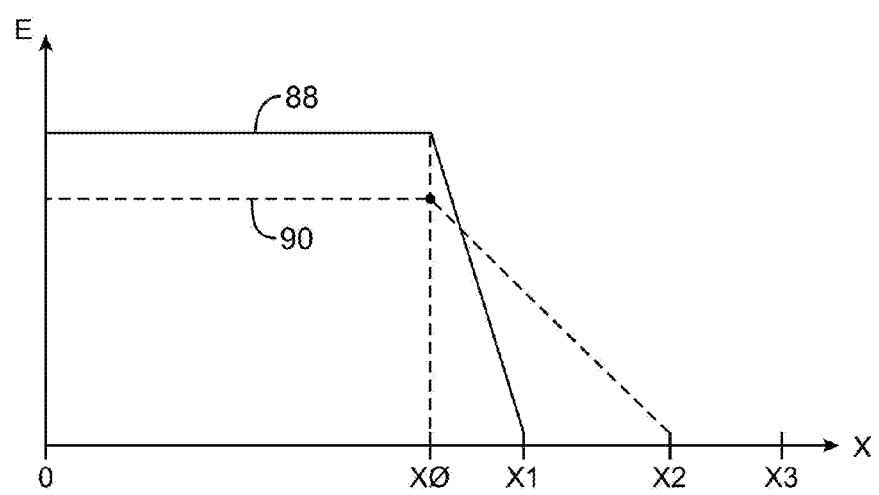
FIG. 8 is a graph showing how the electric field across a transistor of the type shown in FIG. 6 may vary as a function of location within the transistor and as a function of gate conductor doping level in accordance with an embodiment of the present invention.

A simplified graph showing the voltage V(X) in the structure of FIG. 6 under both of these gate doping scenarios is shown in FIG. 7. A corresponding graph of the electric field in the structure of FIG. 6 is shown in FIG. 8. In the example of FIGS. 7 and 8, a positive voltage V0 is being applied at X3 and structure 72 of FIG. 6 corresponds to an n-channel MOS device. As shown by solid line 84 and dashed line 86 in the graph of FIG. 7, the voltage V drops from its maximum value of V0 at X3 to a minimum value of 0 volts at X=0. (The voltage in the channel of the transistor is not modeled in this example.) Lines 88 and 90 of FIG. 8 represent the electric field in structure 72 of FIG. 6. Solid line 88 of FIG. 8 corresponds to solid line 84 of FIG. 7. Dashed line 90 of FIG. 8 corresponds to dashed line 86 in FIG. 7.

Solid lines 84 and 88 correspond to a situation in which polysilicon layer 78 has a relatively high doping level, whereas dashed lines 86 and 90 correspond to a situation in which polysilicon layer 78 has a lower doping level. When a high amount of doping is used, the width of the depletion layer is X1-X0 and corresponds to a voltage drop of V1. When a reduced amount of gate doping is used, more of the polysilicon is depleted for a given amount of applied voltage, so the depletion layer width is X2-X0 and the voltage drop across the depletion layer will be V2.

The optimum amount of doping to use in the polysilicon gate depends on the voltage level that a transistor is designed to withstand. Consider, as an example, a transistor that has a 60 Å oxide layer thickness. This oxide layer thickness may be suitable for forming 2.5 volt transistors having polysilicon gate conductors with normal doping levels (e.g., $10^{20}$ cm$^{-3}$). It may be desired to modify the doping level of the polysilicon gate in this type of transistor so that the transistor will be able to handle 3.3 volt signals (as an example). The doping level required for the polysilicon gate conductor can be calculated using equations 1-9.

The magnitude of the voltage drop across the depletion layer (Vd) is given by equation 1.

$$Vd=3.3 \text{ volts}-2.5 \text{ volts} \tag{1}$$

From equation 1, we obtain a Vd value of 0.8 volts. The voltage drop Vd across the depletion layer is equal to the integrated electric field, as shown in equation 2.

$$Vd=0.5E_{si}(X0)W_d \tag{2}$$

In equation 2, $E_s(X0)$ is the electric field in silicon 74 at position X=X0, and $W_d$ is the width of the depletion layer in the polysilicon gate. Solving equation 2 for $W_d$ produces equation 3.

$$Wd=2V_d/E_{si}(X0) \tag{3}$$

The value of Vd is known to be 0.8 volts from equation 1. At position X=X0, the principle of continuity of electric field strength gives equation 4.

$$\in_{si}E_{si}(X0)=\in_{ox}E_{ox}(X0) \tag{4}$$

In equation 4, $\in_{si}$ is the dielectric constant of silicon (11.7) and $\in_{ox}$ is the dielectric constant of the gate oxide layer (3.9). Solving equation 4 for $E_{si}(X0)$ produces equation 5.

$$E_{si}(X0)=\in_{ox}E_{ox}(X0)/\in_{si} \tag{5}$$

The electric field $E_{ox}(X0)$ can be calculated from the known oxide thickness Tox (60 Å) and the known voltage drop across the gate oxide layer (Vox=2.5 volts) using equation 6.

$$E_{ox}(X0)=Vox/Tox \tag{6}$$

From equation 6, we obtain a value of Eox(X0) of $4.17*10^{10}$ V/cm. The ratio of $\in_{ox}$ to $\in_{si}$ can be computed as shown in equation 7.

$$\in_{ox}/\in_{Si} = 3.9/11.7 = 1/3 \qquad (7)$$

Solving equation 5 using the value of $E_{ox}(X0)$ from equation 6 and the ratio of $\in_{ox}/\in_{Si}$ from equation 7 gives the value for $E_{Si}(X0)$ shown in equation 8.

$$E_{Si}(X0) = 1.25*10^{11} \text{ V/cm} \qquad (8)$$

Solving equation 3 gives Wd=115 Å. This silicon thickness is equivalent to an oxide thickness of 38 Å, so the thickness of Tox has been effectively increased from 60 Å (sufficient to withstand 2.5 volt signals) to 98 Å (60 Å+38 Å) (sufficient to withstand 3.3 volt signals).

The doping level Nd that will produce the appropriate amount of depletion layer thickness can be computed using the relationship of equation 9.

$$E_{Si}(X0) = [q/\in_0\in_{si}]Nd \ Wd \qquad (9)$$

Solving equation 9 for Nd produces an estimated Nd value of $7.8*10^{18}$ cm$^{-3}$.

As this example demonstrates, reducing the doping of the polysilicon gate for some of the 2.5 volt transistors from about $10^{20}$ cm$^{-3}$ to about $10^{19}$ cm$^{-3}$ or less increases the depletion layer width in the polysilicon gate by an amount sufficient to make the transistors able to withstand 3.3 volt signals. The enhancement in the ability of the transistors to handle higher voltages is accomplished without changing the gate oxide thickness of the 2.5 volt transistors. As a result, the gate oxide layers in both the 2.5 volt transistors and the 3.3 volt transistors can be fabricated during the same process step. This avoids the use of additional oxide layer formation operations to form oxides of different thicknesses in these transistors during fabrication of integrated circuit 10.

FIG. 9 is a table showing the design parameters that are associated with the transistors on a conventional integrated circuit. In the first column of the table of FIG. 9, the category of each type of transistor is listed. The transistors of the first and second rows of the FIG. 9 table are associated with core logic. The transistors that are associated with the third and fourth rows are associated with input-output circuitry.

The minimum gate length Lmin that is associated with each transistor type is shown in the second column of the FIG. 9 table. As shown in this column, the minimum gate length for the core logic transistors is 45 nm, indicating that the semiconductor fabrication process associated with FIG. 9 is a 45 nm process. The transistors in the input-output circuitry tend to be larger (i.e., having Lmin values of 270 nm to 350 nm).

The column of the FIG. 9 table that is labeled Vmax indicates the maximum voltage that each set of transistors is designed to handle under normal operating conditions. For example, the core logic transistors of the first row are designed to operate reliably at power supply voltages and signal levels of 0.9 volts, whereas the core logic transistors of the second row are designed to operate reliably at power supply voltages and signal levels of 1.1 volts. The input-output transistors of the third row are designed to handle voltages of 2.5 volts, whereas the input-output transistors associated with the fourth row are designed to handle voltages of 3.3 volts.

The fourth column of the FIG. 9 table represents the gate oxide thickness Tox for each transistor type. The 0.9 volt core logic transistors have a gate oxide thickness of 12 Å. In order to ensure reliable operation, the 1.1 volt core logic transistors have a thicker gate oxide (i.e., 17 Å). As indicated by the third and fourth rows in the FIG. 9 table, the 2.5 volt transistors have a 60 Å gate oxide thickness and the 3.3 volt transistors have a 80 Å oxide thickness. As indicated by the entries in the fifth column, the gate doping level for all of the transistors on the conventional integrated circuit is identical (about $10^{20}$ cm$^{-3}$). The gate depletion layer thickness is therefore nearly identical for all of the transistors on the conventional integrated circuit, exhibiting a slight increase at larger voltages, as indicated by the sixth column. As shown in the seventh column of the table in FIG. 9, the equivalent oxide thicknesses of the transistors increase to reflect their increased voltage handling capabilities (i.e., the EOT for the 0.9 volt transistors is less than the EOT for the 1.1 volt transistors, which in turn is less than the EOT for the 2.5 volt transistors. The EOT of the 3.3 volt transistors is greater than the EOT for the 2.5 volt transistors.

As demonstrated by the example of FIG. 9, the gate oxide thicknesses of the transistors in a conventional integrated circuit are typically tailored to support the voltage level that the transistors are designed to support. Transistors that are required to support larger power supply voltages and voltage signal levels therefore have thicker gate oxides. It is not possible to support larger voltages with the lower-voltage transistors in these designs, because the lower-voltage transistors have thinner gate oxides that make them susceptible to damage from hot carriers when exposed to larger voltages.

As a comparison to the conventional integrated circuit of FIG. 9, the table of FIG. 10 sets forth design parameters that may be associated with the transistors on an illustrative integrated circuit in accordance with an embodiment of the present invention. In the first column of the table of FIG. 10, the category of each type of transistor is listed. As with the conventional arrangement of FIG. 9, the transistors of the first and second rows of the FIG. 10 table are associated with core logic. The transistors that are associated with the third and fourth rows of the FIG. 10 table are associated with input-output circuitry. This is merely illustrative. In general, different groups of transistors may be associated with any suitable types of circuitry on the integrated circuit.

The minimum gate length Lmin that is associated with each transistor type in the FIG. 10 example is shown in the second column of the table and matches the minimum gate length values of the transistors in the FIG. 9 table. As shown in the second column of the table of FIG. 10, the minimum gate length for the core logic transistors is 45 nm and the minimum gate length for the input-output transistors is 270 nm to 350 nm. In general, the minimum gate length values for the transistors on a given integrated circuit may be set to any suitable values. As process technology advances, smaller linewidths and therefore smaller gate lengths are expected to be feasible.

The column of the FIG. 10 table that is labeled Vmax lists the maximum voltage that each set of transistors is designed to handled under normal operating conditions. For example, the core logic transistors of the first row are designed to operate reliably at power supply voltages and signal levels of 0.9 volts, whereas the core logic transistors of the second row are designed to operate reliably at power supply voltages and signal levels of 1.1 volts. As with the conventional arrangement of FIG. 9, the input-output transistors of the third row in FIG. 10 are designed to handle voltages of 2.5 volts, whereas the input-output transistors associated with the fourth row in FIG. 10 are designed to handle voltages of 3.3 volts.

The fourth column of the table in FIG. 10 represents the gate oxide thickness Tox for each transistor type. The 0.9 volt core logic transistors have a gate oxide thickness of 12 Å, whereas the 1.1 volt core logic transistors have a gate oxide thickness of 17 Å. Using a thinner gate oxide thickness for the 0.9 volt transistors than the 1.1 volt transistors ensures that the 0.9 volt transistors switch as fast as possible.

As indicated by the third row in the FIG. 10 table, the 2.5 volt transistors have a 60 Å gate oxide thickness, as with the 2.5 volt transistors in the conventional arrangement described in connection with the table of FIG. 9. However, unlike the conventional arrangement of FIG. 9 in which the 3.3 volt transistors have a 80 Å oxide thickness, the 3.3 volt transistors in the arrangement of FIG. 10 have a 60 Å gate oxide thickness, just as with the 2.5 volt transistors of FIG. 10. Because the 3.3 volt transistors can be fabricated using the same gate oxide as the 2.5 volt transistors, it is possible to eliminate the process steps associated with forming the 80 Å gate oxide layer that is formed in the conventional integrated circuit of FIG. 9.

In order to ensure that the 3.3 volt transistors in the FIG. 10 arrangement are able to withstand 3.3 volt power supply and data signal levels, the doping level of the polysilicon gate for the 3.3 volt transistors is reduced relative to that of the other groups of transistors (which may have gate conductor doping levels and source and drain doping levels of at least $10^{20}$ $cm^{-3}$). As shown in the fifth column of the table of FIG. 10, the gate doping level for the polysilicon in the 0.9 volt, 1.1 volt, and 2.5 volt transistors on the integrated circuit may be identical (about $10^{20}$ $cm^{-3}$), but the gate doping level for the polysilicon gate in the 3.3 volt transistors is different. In particular, the gate doping level for the polysilicon gate of the 3.3 volt transistor can be reduced to about $8*10^{19}$ $cm^{-3}$ (i.e., less than $10^{19}$ $cm^{-3}$) in accordance with the calculated doping level Nd from equation 9. The gate depletion layer thickness is 5 Å for the 0.9 volt and 1.1 volt transistors and, due to the voltage dependence of the depletion layer thickness, 8 Å for the 2.5 volt transistors, as with the conventional transistors of FIG. 9. However, because the polysilicon gate of the 3.3 volt transistors has a reduced doping level, its depletion layer thickness is enlarged significantly to 38 Å (relative to the 12 Å depletion layer thickness for the conventional 3.3 V transistors of FIG. 9), as indicated by the last row in the sixth column of the table of FIG. 10.

The enlarged depletion layer thickness for the 3.3 volt transistors increases the equivalent oxide thickness for this group of transistors to about 98 Å, as indicated in the EOT column of FIG. 10. This ensures that the 3.3 volt transistors will be able to handle 3.3 volt power supply and data signals, even though the oxide thickness for the 3.3 volt transistors is the same as the oxide thickness for the 2.5 volt transistors.

Figure 11:
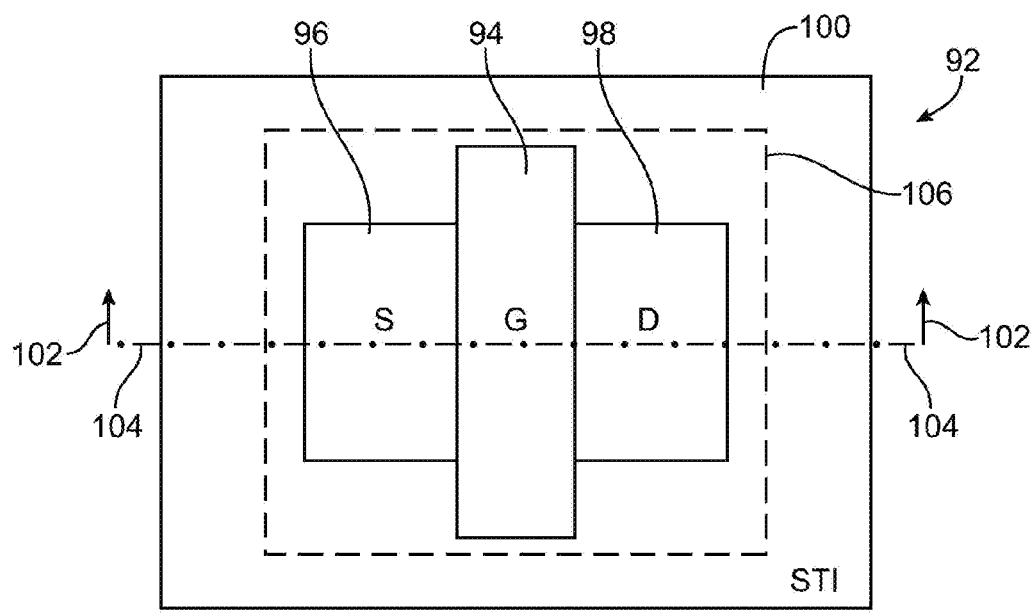
FIG. 11 is a top view of a conventional metal-oxide-semiconductor transistor.

A top view of an conventional transistor 92 is shown in FIG. 11. Transistor 92 has a source region 96, a gate region 94, and a drain region 98. Source region 96, gate region 94, and drain region 98 are surrounded by shallow trench isolation (STI) oxide in region 100. The body contact of transistor 92 is not shown. During fabrication, dopant for the gate region 94, the source region 96, and the drain region 98 is implanted into gate region 94, source region 96, and drain region 98 using ion implantation techniques. A mask of photoresist may have an opening that permits dopant for the gate, source, and drain regions to be implanted. The location of the opening in the implant mask is indicated by rectangular dashed line 106 in FIG. 11. During ion implantation, dopant ions pass through the mask opening and are implanted into the gate, source, and drain.

Figure 12:
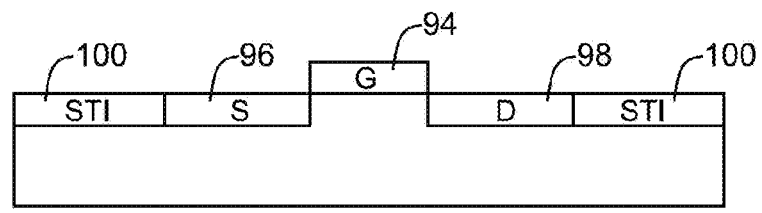
FIG. 12 a cross-sectional side view of the conventional metal-oxide-semiconductor transistor of FIG. 11.

A cross-sectional side view of the transistor 92 of FIG. 11 taken along line 104 and viewed in direction 102 is shown in FIG. 12.

With the conventional doping technique of FIG. 11, the polysilicon gate conductor is doped at the same time as the source and drain. As a result, the polysilicon gate conductor is doped heavily (e.g., $10^{20}$ $cm^{-3}$, just as the source and drain). All transistors on a conventional integrated circuit may receive gate doping at the same time.

Figure 13:
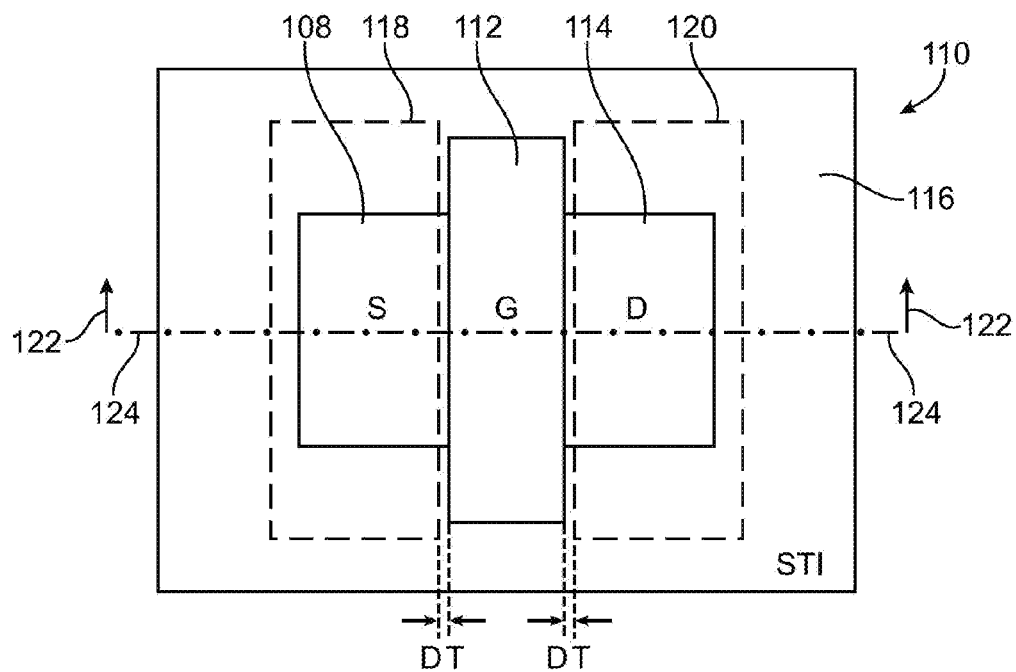
FIG. 13 is a top view of a metal-oxide-semiconductor transistor in accordance with an embodiment of the present invention.

A top view of a transistor 110 in accordance with an embodiment of the present invention is shown in FIG. 13. Transistor 110 has a source region 108, a gate region 112, and a drain region 114. Source region 108, gate region 112, and drain region 114 may be isolated from other devices on an integrated circuit. For example, source region 108, gate region 112, and drain region 114 may be surrounded by shallow trench isolation (STI) oxide in region 116. The body contact of transistor 110 is not shown.

During fabrication, dopant for the gate region 112 can be introduced at a different doping concentration than the dopant for source region 108 and drain region 114. This allows the polysilicon or other semiconductor of the gate to be doped with a lower doping density than the source region 108 and drain region 114.

Any suitable technique may be used for doping regions 108, 112, and 114. With one suitable arrangement, a layer of photoresist or other material is formed on top of source region 108, gate region 112, drain region 114, and shallow trench isolation region 116. Separate source and drain implant openings may then be formed in the photoresist mask. In the example of FIG. 13, an illustrative source implant mask opening 118 and an illustrative drain implant mask opening 120 have been formed over the source region 108 and drain region 114, respectively.

Gate region 112 is not doped during the ion implantation step that is used to dope source region 108 and drain region 114 through mask openings 118 and 120. As a result, the doping level of gate region 112 is less than the doping level of source region 108 and drain region 114. For example, gate region 112 may be doped to a doping concentration of $8*10^{18}$ $cm^{-3}$ (e.g., less than $10^{19}$ $cm^{-3}$), whereas source region 108 and drain region 114 may be doped to greater than $10^{20}$ $cm^{-3}$ (as examples). Gate region 112 may be doped during the process of growing polysilicon gate layer 112, during one or more separate low-level implantation steps (e.g., using masks with openings such as mask opening 106 of FIG. 11), or during any other suitable doping operations.

Transistors on the integrated circuit that do not require gates with reduced doping levels (e.g., the 0.9 volt, 1.1 volt, and 2.5 volt transistors in the FIG. 10 example) can be fabricated using ion implantation masks with conventionally shaped openings such as opening 106 of FIG. 11. In these transistors, the source, drain, and gate conductor may be doped heavily (e.g., to $10^{20}$ $cm^{-3}$ or more).

With the FIG. 13 arrangement, mask openings 118 and 120 are preferably offset from the edges of gate layer 112 by a lateral clearance DT. This ensures that the relatively large amount of dopant that is being implanted into the source and drain regions does not impinge on gate region 112. Eliminating high levels of dopant from region 112 in this way helps to prevent region 112 from being doped excessively near its edges, which could prevent the desired depletion layer from forming in region 112.

Figure 14:
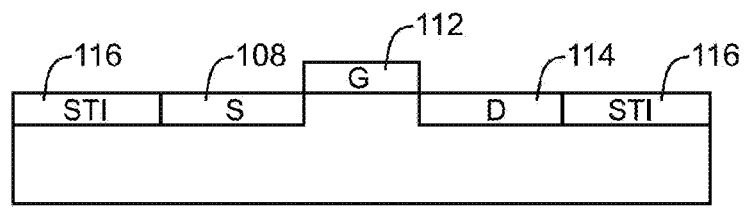
FIG. 14 is a cross-sectional side view of the illustrative metal-oxide-semiconductor transistor of FIG. 13 in accordance with an embodiment of the present invention.

A cross-sectional side view of the transistor 110 of FIG. 13 taken along line 124 and viewed in direction 122 is shown in FIG. 14.

The foregoing is merely illustrative of the principles of this invention and various modifications can be made by those skilled in the art without departing from the scope and spirit of the invention.

What is claimed is:

1. An integrated circuit comprising:
   a first plurality of n-channel transistors each having a gate that includes a first gate oxide with a first gate oxide layer thickness and that includes a first gate conductor with a first gate conductor doping concentration;

a second plurality of n-channel transistors each having a gate that includes a second gate oxide with a second gate oxide layer thickness and that includes a second gate conductor with a second gate conductor doping concentration, wherein the second gate conductor doping concentration is less than the first gate conductor doping concentration and wherein the first gate oxide layer thickness and the second gate oxide layer thickness are equal;

a third plurality of n-channel transistors; and a fourth plurality of n-channel transistors, wherein the first plurality of n-channel transistors handle voltages up to a first maximum voltage, wherein the second plurality of n-channel transistors handle voltages up to a second maximum voltage that is greater than the first maximum voltage, wherein the third plurality of n-channel transistors handle voltages up to a third maximum voltage that is less than the first maximum voltage, wherein the fourth plurality of n-channel transistors handle voltages up to a fourth maximum voltage that is less than the third maximum voltage, wherein the third plurality of n-channel transistors each have a gate with a gate oxide of a third gate oxide layer thickness, wherein the fourth plurality of n-channel transistors each have a gate with a gate oxide of a fourth gate oxide layer thickness, wherein the fourth gate oxide layer thickness is less than the third gate oxide layer thickness, and wherein the third gate oxide layer thickness is less than the first gate oxide layer thickness.

2. The integrated circuit defined in claim 1 wherein the first and second gate conductors comprise a doped semiconductor.

3. An integrated circuit comprising:

a first plurality of n-channel transistors each having a gate that includes a first gate oxide with a first gate oxide layer thickness and that includes a first gate conductor with a first gate conductor doping concentration;

a second plurality of n-channel transistors each having a gate that includes a second gate oxide with a second gate oxide layer thickness and that includes a second gate conductor with a second gate conductor doping concentration, wherein the second gate conductor doping concentration is less than the first gate conductor doping concentration and wherein the first gate oxide layer thickness and the second gate oxide layer thickness are equal; and a third plurality of n-channel transistors, wherein the first plurality of n-channel transistors handle voltages up to a first maximum voltage, wherein the second plurality of n-channel transistors handle voltages up to a second maximum voltage that is greater than the first maximum voltage, and wherein the third plurality of n-channel transistors handle voltages up to a third maximum voltage that is less than the first maximum voltage.

4. The integrated circuit defined in claim 3 further comprising:

a fourth plurality of n-channel transistors, wherein the fourth plurality of n-channel transistors handle voltages up to a fourth maximum voltage that is less than the third maximum voltage.

5. An integrated circuit comprising:

first transistors that operate at voltages up to a first maximum voltage;

second transistors that operate at voltages up to a second maximum voltage that is greater than the first maximum voltage;

third transistors that operate at voltages up to a third maximum voltage that is greater than the second maximum voltage; and fourth transistors that operate at voltages up to a fourth maximum voltage that is greater than the third maximum voltage, wherein the first transistors each have a first gate oxide layer thickness, wherein the second transistors each have a second gate oxide layer thickness that is greater than the first gate oxide layer thickness, wherein the third transistors each have a third gate oxide layer thickness that is greater than the than the second gate oxide layer thickness, and wherein the fourth transistors each have a gate oxide layer thickness that is equal to the third gate oxide layer thickness.

6. The integrated circuit defined in claim 5 wherein the gates of the third transistors each have a first doping level, wherein the gates of the fourth transistors each have a second doping level, and wherein the second doping level is less than the first doping level.

7. The integrated circuit defined in claim 5 wherein the first, second, third, and fourth transistors comprises n-channel metal-oxide-semiconductor transistors with semiconductor gates.

8. The integrated circuit defined in claim 5 wherein the third and fourth transistors each have polysilicon gates and wherein the polysilicon gates of the fourth transistors have a doping level of less than $10^{19}$ cm$^{-3}$.

9. The integrated circuit defined in claim 5 wherein the third and fourth transistors have polysilicon gates with first and second depletion layer thicknesses, wherein the first depletion layer thickness is less than the second depletion layer thickness.

10. The integrated circuit defined in claim 5 further comprising core logic, wherein the first and second transistors are included in the core logic.

11. The integrated circuit defined in claim 5 further comprising:

core logic;

input-output circuitry connected to the core logic; and input-output pins connected to the input-output circuitry, wherein the first and second transistors are part of the core logic.

12. The integrated circuit defined in claim 5 further comprising:

core logic;

input-output circuitry connected to the core logic; and input-output pins connected to the input-output circuitry, wherein the first and second transistors are part of the core logic and wherein the third and fourth transistors are part of the input-output circuitry.

13. An integrated circuit comprising:

a first group of metal-oxide-semiconductor transistors each having a source, a drain, and a gate, wherein the gate of each of the first group of metal-oxide-semiconductor transistors has an associated gate insulator and an associated semiconductor gate conductor that is located adjacent to the gate insulator; and a second group of metal-oxide-semiconductor transistors each having a source, a drain, and a gate, wherein the gate of each of the second group of metal-oxide-semiconductor transistors has an associated gate insulator and an associated semiconductor gate conductor that is located adjacent to the gate insulator, wherein each semiconductor gate conductor in the first group of metal-oxide-semiconductor transistors has a first doping concentration, wherein each semiconductor gate conductor in the second group of metal-oxide-semiconductor transistors has a second doping concentration that is different than the first doping concentration, wherein the gate insulator in each of the metal-oxide-semiconductor transistors of the first group and the gate insulator in each of the metal-oxide-semiconductor transistors of the second group have a thickness that is equal, wherein the source and drain of each of the metal-oxide-semiconductor transistors in the first group has a doping concentration of at least $10^{20}$ cm$^{-3}$, and wherein the first doping concentration is greater than $10^{20}$ cm$^{-3}$.

14. The integrated circuit defined in claim 13 wherein the semiconductor gate conductor in the metal-oxide-semiconductor transistors of the first and second groups comprises doped polysilicon.

15. The integrated circuit defined in claim 13 wherein the second doping concentration is at least ten times less than the first doping concentration.

16. An integrated circuit comprising:
a first group of metal-oxide-semiconductor transistors each having a source, a drain, and a gate, wherein the gate of each of the first group of metal-oxide-semiconductor transistors has an associated gate insulator and an associated semiconductor gate conductor that is located adjacent to the gate insulator;
a second group of metal-oxide-semiconductor transistors each having a source, a drain, and a gate, wherein the gate of each of the second group of metal-oxide-semiconductor transistors has an associated gate insulator and an associated semiconductor gate conductor that is located adjacent to the gate insulator, wherein each semiconductor gate conductor in the first group of metal-oxide-semiconductor transistors has a first doping concentration, wherein each semiconductor gate conductor in the second group of metal-oxide-semiconductor transistors has a second doping concentration that is different than the first doping concentration, wherein the gate insulator in each of the metal-oxide-semiconductor transistors of the first group and the gate insulator in each of the metal-oxide-semiconductor transistors of the second group have a thickness that is equal, and wherein the second doping concentration is less than the first doping concentration; and
a layer of shallow trench isolation adjacent to the source, drain, and gate of each of the metal-oxide-semiconductor transistors in the second group of transistors, wherein the source and drain regions contain dopant that is implanted through respective mask openings that do not overlap the gate.

17. The integrated circuit defined in claim 13 further comprising programmable logic circuitry and input-output circuitry, wherein the second group of metal-oxide-semiconductor transistors is contained within the input-output circuitry.

18. The integrated circuit defined in claim 13 further comprising core logic and input-output circuitry, wherein the first group of metal-oxide-semiconductor transistors and the second group of metal-oxide-semiconductor transistors are included in the input-output circuitry.

* * * * *